United States Patent
Tapily et al.

(10) Patent No.: US 11,170,992 B2
(45) Date of Patent: Nov. 9, 2021

(54) AREA SELECTIVE DEPOSITION FOR CAP LAYER FORMATION IN ADVANCED CONTACTS

(71) Applicant: Tokyo Electron Limited, Tokyo (JP)

(72) Inventors: Kandabara Tapily, Albany, NY (US); Gerrit Leusink, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/396,360

(22) Filed: Apr. 26, 2019

(65) Prior Publication Data

US 2019/0333763 A1 Oct. 31, 2019

Related U.S. Application Data

(60) Provisional application No. 62/663,916, filed on Apr. 27, 2018.

(51) Int. Cl.
*H01L 21/02* (2006.01)
*H01L 21/768* (2006.01)
*H01L 21/285* (2006.01)

(52) U.S. Cl.
CPC .... *H01L 21/02263* (2013.01); *H01L 21/0228* (2013.01); *H01L 21/02164* (2013.01); *H01L 21/02172* (2013.01); *H01L 21/02186* (2013.01); *H01L 21/02214* (2013.01); *H01L 21/02304* (2013.01); *H01L 21/02312* (2013.01); *H01L 21/28562* (2013.01); *H01L 21/76834* (2013.01); *H01L 21/76849* (2013.01); *H01L 21/76888* (2013.01)

(58) Field of Classification Search
CPC ........... H01L 21/7682; H01L 21/76829; H01L 21/76832; H01L 21/76834; H01L 21/76849; H01L 21/76888; H01L 21/76856; H01L 21/76858; H01L 21/76859
See application file for complete search history.

(56) References Cited

U.S. PATENT DOCUMENTS

| | | | |
|---|---|---|---|
| 5,854,127 A * | 12/1998 | Pan | H01L 21/76897 438/629 |
| 2008/0185567 A1 | 8/2008 | Kumar et al. | |
| 2010/0176514 A1 | 7/2010 | Yang et al. | |
| 2011/0272812 A1 * | 11/2011 | Horak | H01L 21/76832 257/758 |

(Continued)

OTHER PUBLICATIONS

Korean Intellectual Property Office, The International Search Report and the Written Opinion for international application No. PCT/US2019/029444, dated Aug. 14, 2019, 11pp.

*Primary Examiner* — Ermias T Woldegeorgis

(57) ABSTRACT

A method of area selective deposition for cap layer formation in advanced semiconductor contacts. The method includes providing a planarized substrate including a first dielectric layer and a first metal layer, oxidizing a surface of the first metal layer to form an oxidized metal layer, and selectively depositing a second dielectric layer on the oxidized metal layer. The selectively depositing the second dielectric layer can include moving the planarized substrate below a gas inlet dispensing a deposition gas during a spatial vapor phase deposition process, where the deposition gas is preferentially exposed to the oxidized metal layer extending above a surface of the first dielectric layer.

19 Claims, 6 Drawing Sheets

(56) References Cited

U.S. PATENT DOCUMENTS

| | | |
|---|---|---|
| 2012/0223407 A1 | 9/2012 | Scheiper et al. |
| 2012/0252210 A1 | 10/2012 | Tohnoe |
| 2015/0299848 A1* | 10/2015 | Haukka ............ H01L 21/76829 427/123 |
| 2018/0076027 A1* | 3/2018 | Tapily ............... H01L 21/76883 |
| 2019/0164749 A1* | 5/2019 | Tapily ............... H01L 21/02274 |

\* cited by examiner

AREA SELECTIVE DEPOSITION FOR CAP LAYER FORMATION IN ADVANCED CONTACTS

CROSS-REFERENCE TO RELATED APPLICATIONS

This application is related to and claims priority to U.S. Provisional Patent Application Ser. No. 62/663,916 filed on Apr. 27, 2018, the entire contents of which are herein incorporated by reference.

FIELD OF THE INVENTION

This invention relates to methods for processing a substrate, and more particularly to area selective deposition for cap layer formation in advanced contacts.

BACKGROUND OF THE INVENTION

As smaller transistors are manufactured, the critical dimension (CD) or resolution of patterned features is becoming more challenging to produce. Self-aligned patterning needs to replace overlay-driven patterning so that cost-effective scaling can continue even after EUV introduction. Patterning options that enable reduced variability, extend scaling and enhanced CD and process control are needed. Selective deposition of thin films are key steps in patterning in highly scaled technology nodes.

SUMMARY OF THE INVENTION

An area selective deposition method for cap layer formation in advanced semiconductor contacts is described. The area selective deposition enables a simplified metallization scheme that requires reduced lithography-based patterning.

According to one embodiment, the method includes a cap layer formation in advanced semiconductor contacts. The method includes providing a planarized substrate including a first dielectric layer and a first metal layer, oxidizing a surface of the first metal layer to form an oxidized metal layer, and selectively depositing a second dielectric layer on the oxidized surface of the first metal layer. The selectively depositing the second dielectric layer can include moving the planarized substrate below a gas inlet dispensing a deposition gas during a spatial vapor phase deposition process, where the deposition gas is preferentially exposed to the oxidized metal layer extending above a surface of the first dielectric layer.

According to another embodiment, the method includes providing a planarized substrate including a first dielectric layer and a first metal layer, selectively depositing a second dielectric layer on the first dielectric layer, where the selectively depositing forms a recessed feature above the first metal layer, filling the recessed feature with a second metal layer, removing the second dielectric layer from the substrate, and selectively depositing a third dielectric layer on the second metal layer.

According to another embodiment, the method includes providing a planarized substrate including a first dielectric layer and a first metal layer, recessing the first dielectric layer below an upper surface of the first metal layer, and selectively depositing a second dielectric layer on the first metal layer.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Figure 1A:
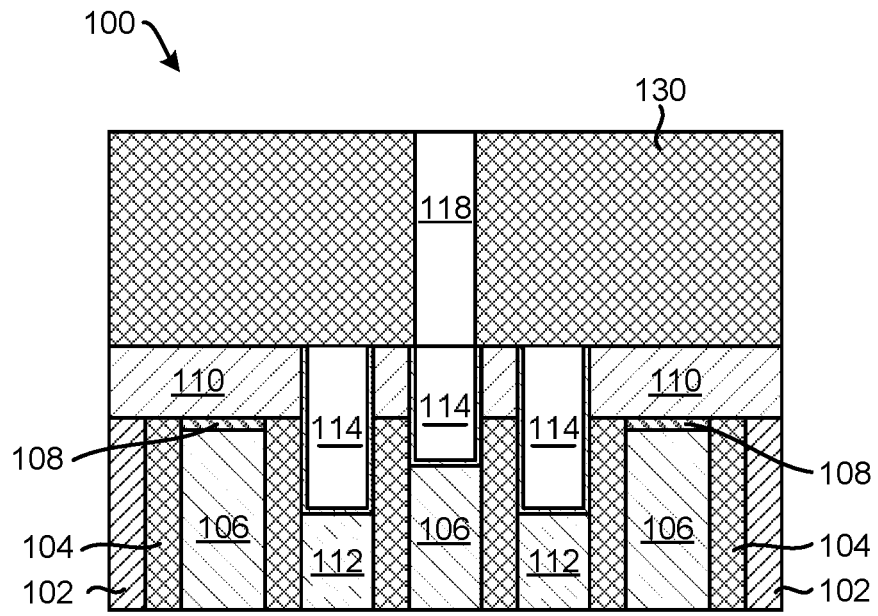
FIGS. 1A-1C schematically show through cross-sectional views a method of processing a substrate according to an embodiment of the invention.
Figure 1B:
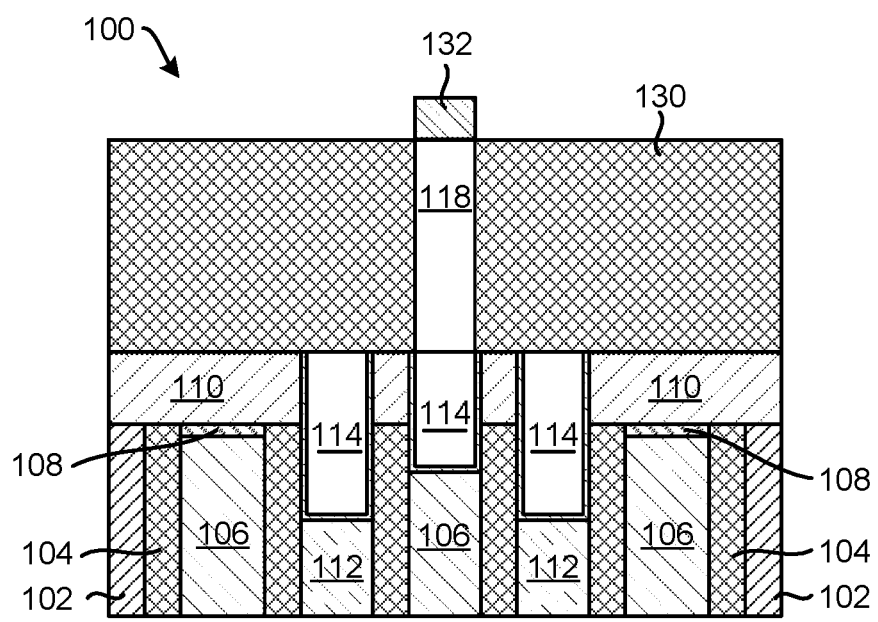
Figure 1C:
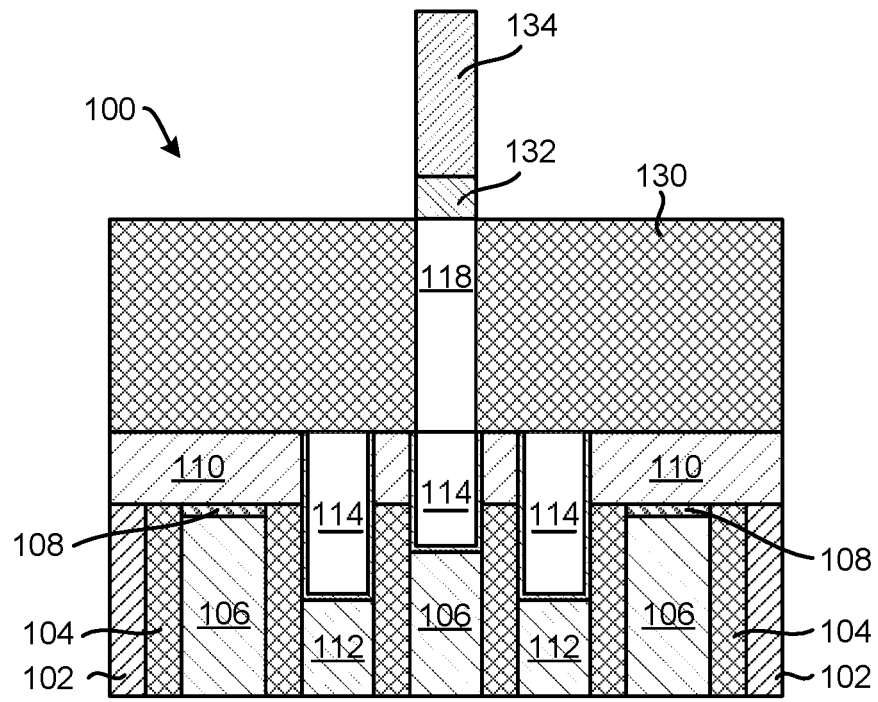

FIGS. 1A-1C schematically show through cross-sectional views a method of processing a substrate according to an embodiment of the invention. The exemplary substrate 100 shown in FIG. 1A contains various material layers commonly found in semiconductor devices, however, embodiments of the invention may be applied to simpler or more advanced semiconductor devices. The substrate 100 contains an oxide layer 102 (e.g., $SiO_2$), a nitride layer 104 (e.g., SiN), a gate contact layer 106, a cap layer 108 (e.g., SiN or SiCN), a source/drain layer 112 (e.g., Si or SiC), a dielectric layer 110 (e.g., $SiO_2$), and a metal-containing layer 114 (e.g., a trench silicide layer: $CoSi_2$, NiSi, or $MoSi_2$). In the exemplary substrate 100, the metal-containing layer 114 and the source/drain layer 112 may be part of a contact region. The substrate 100 further includes a first dielectric layer 130 and a first metal layer 118. The first dielectric layer 130 can, for example, include $SiO_2$ or a low-k material. The first metal layer 118 may, for example, be selected from the group consisting of tungsten (W) metal, ruthenium (Ru) metal, cobalt (Co) metal, molybdenum (Mo), and a combination of thereof. The substrate 100 may be planarized using a chemical mechanical polishing (CMP) process.

FIG. 1B shows the substrate 100 following an oxidation process that oxidizes the exposed first metal layer 118 to form an oxidized metal layer 132 on the first metal layer 118. The oxidation process can include a exposing the substrate 100 to plasma-excited $O_2$ gas. In one example, a W metal layer is oxidized to form an oxidized W metal layer. The oxidation process is accompanied by an increase in in volume since oxidized W (e.g., $WO_3$) occupies a larger volume than W metal. This results in the oxidized W metal layer extending a few nanometers (nm) above the horizontal plane of the W metal layer and the first dielectric layer 130.

FIG. 1C shows the substrate 100 following selective deposition of a second dielectric layer 134 on the oxidized metal layer 132. In one example, the second dielectric layer 134 can include a metal oxide layer or a metal nitride layer. In another example, the second dielectric layer 134 may be selected from the group consisting of $TiO_2$, $HfO_2$, $ZrO_2$, $Al_2O_3$, $SiO_2$, SiN, and a combination thereof. The selective deposition of the second dielectric layer 134 is, at least in part, enabled by the oxidized metal layer 132 extending above the horizontal plane of the first metal layer 118 and the first dielectric layer 130. According to one embodiment, the second dielectric layer 134 may be deposited by spatial deposition by moving the substrate 100 below a gas inlet dispensing a deposition gas during spatial vapor phase deposition process, for example a spatial atomic layer deposition (ALD) process or a spatial chemical vapor deposition (CVD). A rotation speed of the substrate support and the gas exposure parameters may be selected such that the deposition gas is preferentially exposed to a top surface of the raised oxidized metal layer 132 but not to a surface of the first dielectric layer 130 that is below the top surface of the raised oxidized metal layer 132. According to other embodiment, the second dielectric layer 134 may be deposited carefully controlling the precursor exposure, including gas flow, exposure time) in order to preferentially expose the top surface of the raised oxidized metal layer 132.

The second dielectric layer 134, also known as a cap layer, may be used as a hard mask for a subsequent etching process to form a fully self-aligned via, a self-aligned contact, a supervia, or a self-aligned gate contact in the first dielectric layer 130 adjacent the first metal layer 118. The second dielectric layer 134 protects the first metal layer 118 during the etching process by preventing or reducing etching of the first metal layer 118.

Figure 2A:
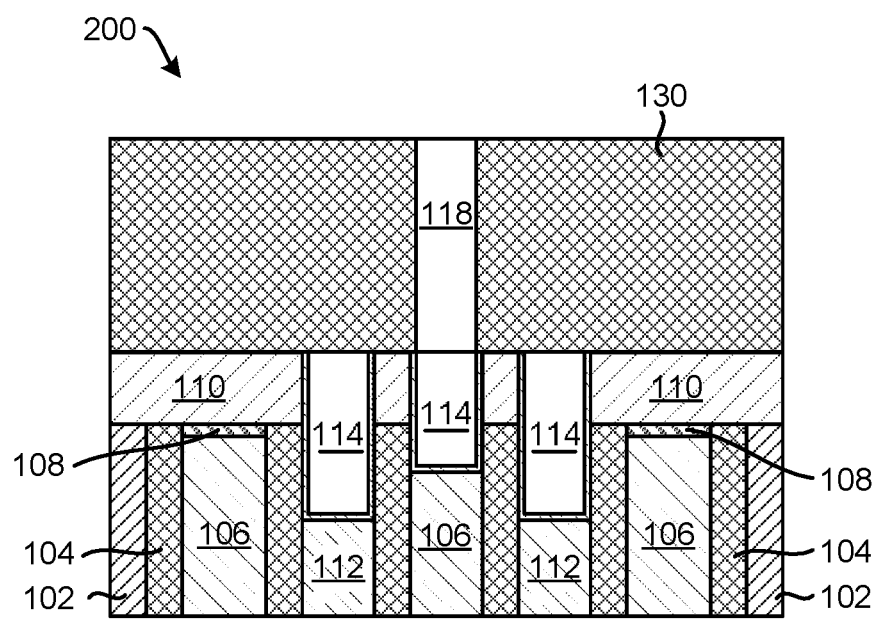
FIGS. 2A-2E schematically show through cross-sectional views a method of processing a substrate according to an embodiment of the invention.
Figure 2B:
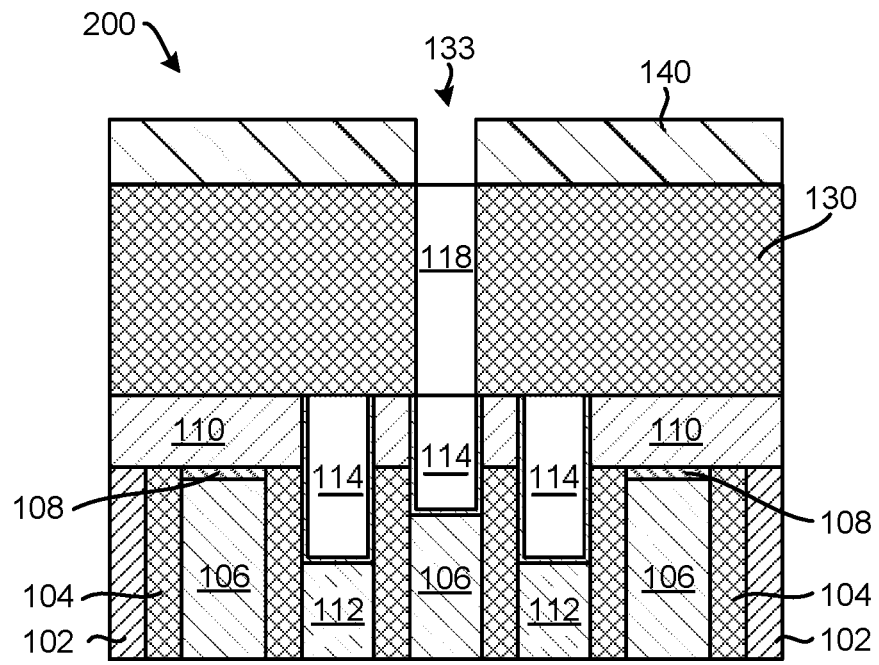

FIGS. 2A-2E schematically show through cross-sectional views a method of processing a substrate according to an embodiment of the invention. The substrate 100 shown in FIG. 1A has been reproduced as substrate 200 in FIG. 2A. FIG. 2B shows the substrate 200 following selective deposition of a second dielectric layer 140 on the first dielectric layer 130. The selective deposition of the second dielectric layer 140 forms a recessed feature 133 above the first metal layer 118. In some examples, the second dielectric layer 140 may be selected from the group consisting of $TiO_2$, $HfO_2$, $ZrO_2$, $Al_2O_3$, $SiO_2$, SiN, and a combination thereof.

In one example, the second dielectric layer 140 can contain $SiO_2$, and the selective deposition may be achieved by alternating exposures of a metal-containing precursor and a silanol gas. The metal-containing precursor selectively adsorbs on the first dielectric layer 130 and subsequently catalyzes reaction of the silanol gas to deposit $SiO_2$ material. The silanol gas may be selected from the group consisting of tris(tert-pentoxy) silanol (TPSOL), tris(tert-butoxy) silanol, and bis(tert-butoxy)(isopropoxy) silanol. The exposures to the silanol gas may be performed in the absence of any oxidizing and hydrolyzing agent, and the substrate may be exposed, at a substrate temperature of approximately 150° C. or less, to a process gas containing a silanol gas to deposit a $SiO_2$ film. The thickness of the $SiO_2$ film is controlled by self-limiting adsorption of the silanol gas on the metal-containing precursor layer. This catalytic effect has been observed until the $SiO_2$ films were about 3 nm thick, thereafter the $SiO_2$ deposition stopped. In another embodiment, the substrate temperature may be approximately 120° C. or less. In yet another embodiment, the substrate temperature may be approximately 100° C. or less.

Examples of metal-containing precursor include aluminum (Al), titanium (Ti), or both aluminum and titanium. Examples of aluminum-containing precursors include: $AlMe_3$, $AlEt_3$, $AlMe_2H$, $[Al(O^sBu)_3]_4$, $Al(CH_3COCHCOCH_3)_3$, $AlCl_3$, $AlBr_3$, $AlI_3$, $Al(O^iPr)_3$, $[Al(NMe_2)_3]_2$, $Al(^tBu)_2Cl$, $Al(^iBu)_3$, $Al(^iBu)_2H$, $AlEt_2Cl$, $Et_3Al_2(O^sBu)_3$, and $Al(THD)_3$. Examples of titanium-containing precursors that have "Ti—N" intra-molecular bonds include $Ti(NEt_2)_4$ (TDEAT), $Ti(NMeEt)_4$ (TEMAT), $Ti(NMe_2)_4$ (TDMAT). Other examples include titanium-containing precursors containing "Ti—C" intra-molecular bonds include $Ti(COCH_3)(\eta5-C_5H_5)_2Cl$, $Ti(\eta5-C_5H_5)Cl_2$, $Ti(\eta5-C_5H_5)Cl_3$, $Ti(\eta5-C_5H_5)_2Cl_2$, $Ti(\eta5-C_5(CH_3)_5)Cl_3$, $Ti(CH_3)(\eta5-C_5H_5)_2Cl$, $Ti(\eta5-C_9H_7)_2Cl_2$, $Ti((\eta5-C_5(CH_3)_5)_2Cl$, $Ti((\eta5-C_5(CH_3)_5)_2Cl_2$, $Ti(\eta5-C_5H_5)_2(\mu-Cl)_2$, $Ti(\eta5-C_5H_5)_2(CO)_2$, $Ti(CH_3)_3(\eta5-C_5H_5)$, $Ti(CH_3)_2(\eta5-C_5H_5)_2$, $Ti(CH_3)_4$, $Ti(\eta5-C_5H_5)(\eta7-C_7H_7)$, $Ti(\eta5-C_5H_5)(\eta8-C_8H_8)$, $Ti(C_5H_5)_2(\eta5-C_5H_5)_2$, $Ti((C_5H_5)_2)_2(\eta-H)_2$, $Ti(\eta5-C_5(CH_3)_5)_2$, $Ti(\eta5-C_5(CH_3)_5)_2(H)_2$, and $Ti(CH_3)_2(\eta5-C_5(CH_3)_5)_2$. $TiCl_4$ is an example of a titanium halide precursor containing a "Ti-halogen" bond.

In another example, the second dielectric layer 140 can contain $TiO_2$, and the selective deposition may be achieved by alternating exposures of a Ti-containing precursor and an oxygen-containing gas.

Figure 2C:
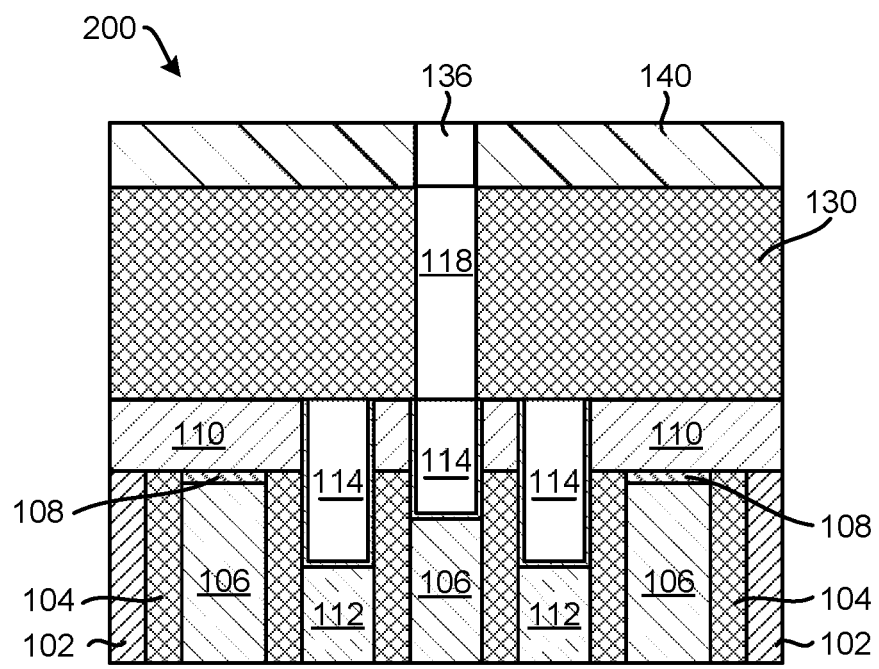

FIG. 2C shows the substrate 200 following selective deposition of a second metal layer 136 on the first metal layer 118 in the recessed feature 133. The second metal layer 136 may fully fill the recessed feature 133. The second metal layer 136 can be selected from the group consisting of tungsten (W) metal, ruthenium (Ru) metal, cobalt (Co) metal, molybdenum (Mo), and a combination of thereof.

In one example, the selective deposition of the second metal layer 136 may be performed in a bottom-up fashion by blocking metal deposition on the first dielectric layer 130. The metal deposition may be blocked by exposing the substrate 200 to a reactant gas containing a hydrophilic functional group that adsorbs on the first dielectric layer 130 but not on the first metal layer 118. The reactant gas can contain a silicon-containing gas, including an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or any combination thereof. In some examples, the reactant gas may be selected from dimethylsilane dimethylamine (DMSDMA), trimethylsilane dimethylamine (TMSDMA), bis(dimethylamino) dimethylsilane (BDMADMS), and other alkyl amine silanes.

Figure 2D:
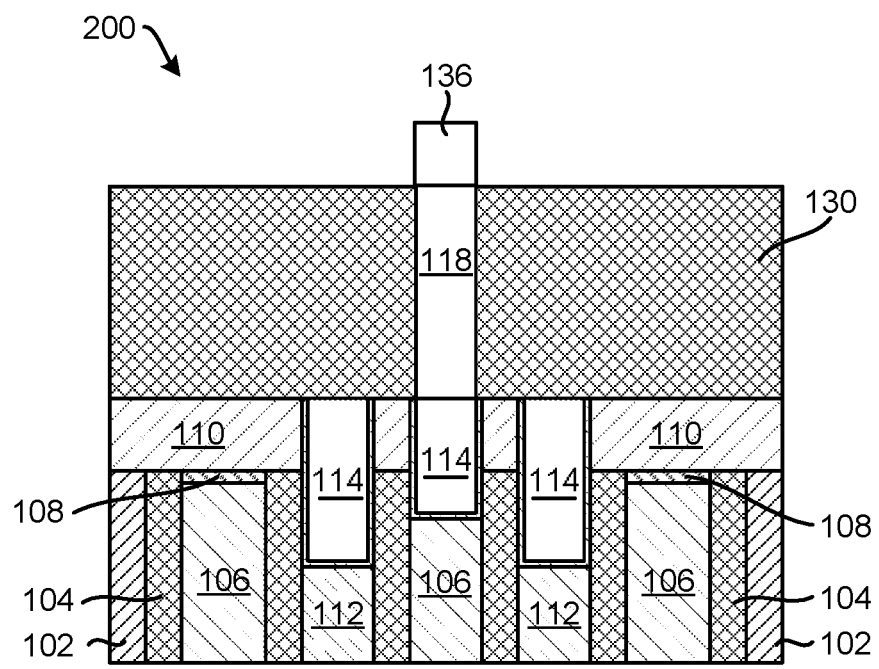

FIG. 2D shows the substrate 200 following removal of the second dielectric layer 140. The removal can include a dry etching process or a wet etching process.

Figure 2E:
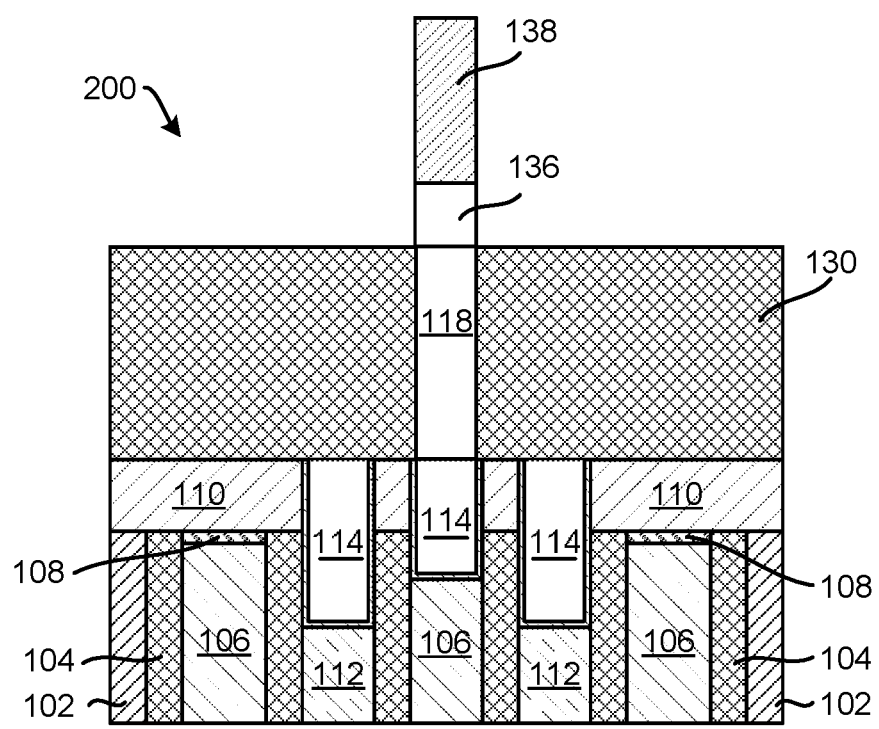

FIG. 2E shows the substrate 200 following selective deposition of a third dielectric layer 138 on the second metal layer 136. Optionally, a surface of the second metal layer 136 may be oxidized using an oxidation process to form an oxidized metal layer and, thereafter, the third dielectric layer 138 selectively deposited on the oxidized metal layer. In one example, the third dielectric layer 138 can include a metal oxide layer or a metal nitride layer. In another example, the third dielectric layer 138 may be selected from the group consisting of $TiO_2$, $HfO_2$, $ZrO_2$, $Al_2O_3$, $SiO_2$, SiN, and a combination thereof. The selective deposition of the third dielectric layer 138 is, at least in part, enabled by the second metal layer 136 extending above the horizontal plane of the first metal layer 118 and the first dielectric layer 130.

According to one embodiment, the third dielectric layer 138 may be deposited by spatial deposition by moving the substrate 100 below a gas inlet dispensing a deposition gas during a spatial vapor phase deposition process, for example a spatial atomic layer deposition (ALD) process or a spatial chemical vapor deposition (CVD). A rotation speed of the substrate support and the gas exposure parameters may be selected such that the deposition gas is preferentially exposed to a top surface of the raised second metal layer 136 but not to a surface of the first dielectric layer 130 that is below the top surface of the raised second metal layer 136. According to other embodiment, the third dielectric layer 138 may be deposited carefully controlling the precursor exposure, including gas flow, exposure time) in order to preferentially expose the top surface of the raised second metal layer 136.

Figure 3A:
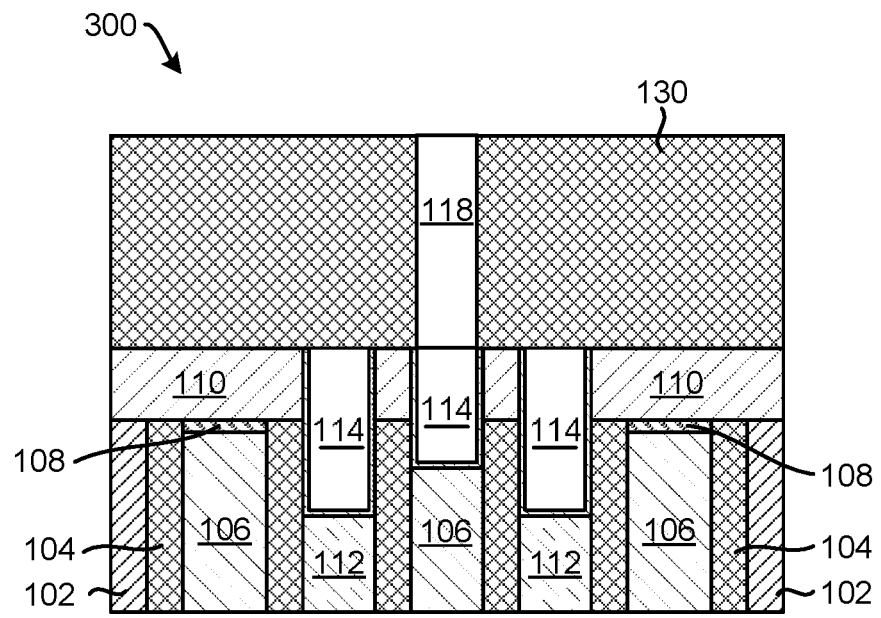
FIGS. 3A-3C schematically show through cross-sectional views a method of processing a substrate according to an embodiment of the invention.
Figure 3B:
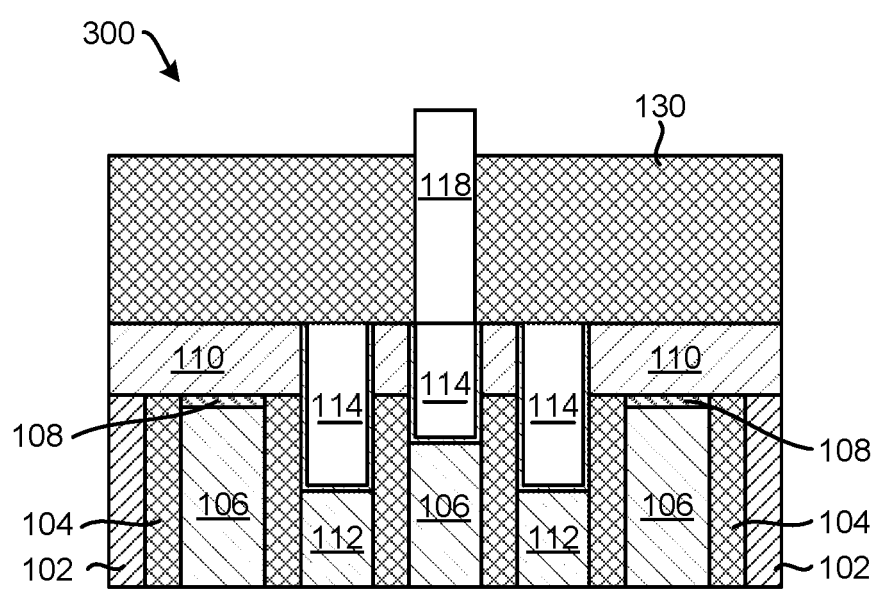
Figure 3C:
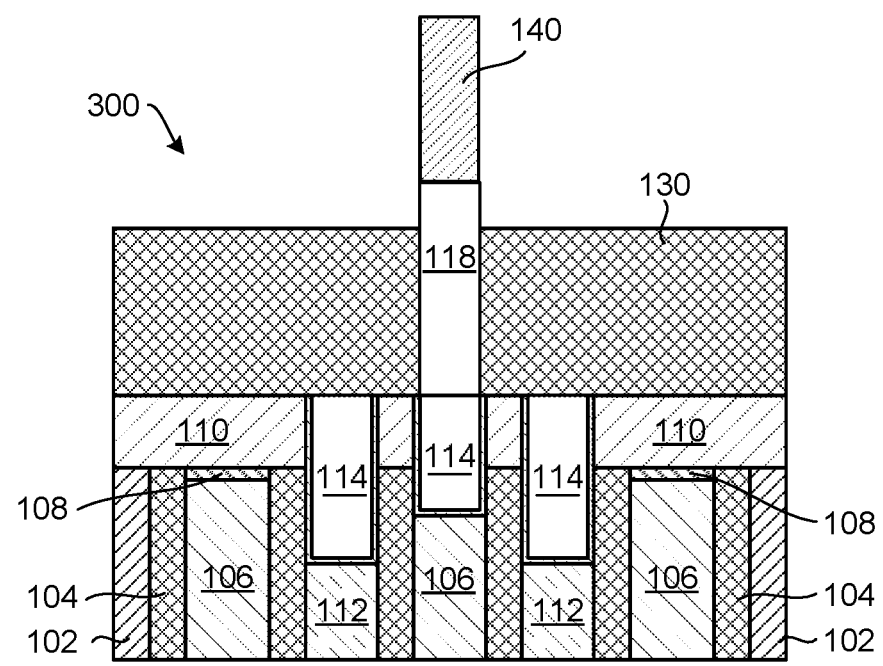

FIGS. 3A-3C schematically show through cross-sectional views a method of processing a substrate according to an embodiment of the invention. The substrate 100 shown in FIG. 1A has been reproduced as substrate 300 in FIG. 3A. FIG. 3B shows the substrate 300 following an etching process that recesses the first dielectric layer below an upper surface of the first metal layer 118. Thereafter, the substrate 300 may be processed as described in FIG. 2E, including selectively depositing a second dielectric layer 140 deposited on the first metal layer 118. Optionally, a surface of the first metal layer 118 may be oxidized using an oxidation process to form an oxidized metal layer and, thereafter, the second dielectric layer 140 selectively deposited on the oxidized metal layer. In one example, the second dielectric layer 140 can include a metal oxide layer or a metal nitride layer. In another example, the second dielectric layer 140 may be selected from the group consisting of $TiO_2$, $HfO_2$, $ZrO_2$, $Al_2O_3$, $SiO_2$, SiN, and a combination thereof. The selective deposition of the second dielectric layer 140 is, at least in part, enabled by the first metal layer 118 extending above the horizontal plane of the first dielectric layer 130.

A plurality of embodiments for an area selective deposition for cap layer formation in advanced semiconductor contacts has been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
   providing a planarized substrate including a first dielectric layer and a first metal layer;
   oxidizing a surface of the first metal layer to form an oxidized metal layer; and
   selectively depositing a second dielectric layer on the oxidized metal layer.

2. The method of claim 1, wherein the first metal layer is selected from the group consisting of tungsten (W) metal, ruthenium (Ru) metal, cobalt (Co) metal, molybdenum (Mo), and a combination of thereof.

3. The method of claim 2, wherein the first metal layer includes W metal and the oxidizing forms an oxidized W metal layer that is accompanied by an increase in in volume such that the oxidized W metal layer extends above a horizontal plane of the first metal layer and the first dielectric layer.

4. The method of claim 1, wherein the selectively depositing the second dielectric layer includes moving the planarized substrate below a gas inlet dispensing a deposition gas during a spatial vapor phase deposition process, and wherein the deposition gas is preferentially exposed to the oxidized metal layer extending above a surface of the first dielectric layer.

5. The method of claim 1, wherein the second dielectric layer is selected from the group consisting of $TiO_2$, $HfO_2$, $ZrO_2$, $Al_2O_3$, $SiO_2$, SiN, and a combination thereof.

6. The method of claim 1, wherein the second dielectric layer is selected from the group consisting of a metal oxide or a metal nitride.

7. The method of claim 1, further comprising:
   using the second dielectric layer as a hard mask for a subsequent etching process to form a fully self-aligned via, a self-aligned contact, a supervia, or a self-aligned gate contact in the first dielectric layer.

8. The method of claim 1, further comprising:
   prior to oxidizing the surface of the first metal layer, recessing the first dielectric layer below an upper surface of the first metal layer.

9. A substrate processing method, comprising:
   providing a planarized substrate including a first dielectric layer and a first metal layer;
   selectively depositing a second dielectric layer on the first dielectric layer, wherein the selectively depositing forms a recessed feature above the first metal layer;
   filling the recessed feature with a second metal layer;
   removing the second dielectric layer from the substrate; and
   selectively depositing a third dielectric layer on the second metal layer.

10. The method of claim 9, wherein the selectively depositing the third dielectric layer includes moving the planarized substrate below a gas inlet dispensing a deposition gas during a spatial vapor phase deposition process, and wherein the deposition gas is preferentially exposed to the second metal layer extending above a surface of the first dielectric layer.

11. The method of claim 9, wherein the first metal layer is selected from the group consisting of tungsten (W) metal, ruthenium (Ru) metal, cobalt (Co) metal, molybdenum (Mo), and a combination of thereof.

12. The method of claim 9, wherein the second metal layer is selected from the group consisting of tungsten (W) metal, ruthenium (Ru) metal, cobalt (Co) metal, molybdenum and a combination of thereof.

13. The method of claim 9, wherein the second dielectric layer is selected from the group consisting of $TiO_2$, $HfO_2$, $ZrO_2$, $Al_2O_3$, $SiO_2$, SiN, and a combination thereof.

14. The method of claim 9, wherein the third dielectric layer is selected from the group consisting of $TiO_2$, $HfO_2$, $ZrO_2$, $Al_2O_3$, $SiO_2$, SiN, and a combination thereof.

15. The method of claim 9, further comprising:
   using the third dielectric layer as a hard mask for a subsequent etching process to form a fully self-aligned via, a self-aligned contact, a supervia, or a self-aligned gate contact in the first dielectric layer.

16. A substrate processing method, comprising:
   providing a planarized substrate including a first dielectric layer and a first metal layer;
   recessing the first dielectric layer below an upper surface of the first metal layer;
   oxidizing a surface of the first metal layer to form an oxidized metal layer;
   selectively depositing a second dielectric layer on the oxidized metal layer; and
   using the second dielectric layer as a hard mask for a subsequent etching process to form a fully self-aligned via, a self-aligned contact, a supervia, or a self-aligned gate contact in the first dielectric layer.

17. The method of claim 16, wherein the selectively depositing the second dielectric layer includes moving the planarized substrate below a gas inlet dispensing a deposition gas during a spatial vapor phase deposition process, and wherein the deposition gas is preferentially exposed to the first metal layer extending above a surface of the first dielectric layer.

18. The method of claim 16, wherein the first metal layer is selected from the group consisting of tungsten (W) metal, ruthenium (Ru) metal, cobalt (Co) metal, molybdenum and a combination of thereof.

19. The method of claim 16, wherein the second dielectric layer is selected from the group consisting $TiO_2$, $HfO_2$, $ZrO_2$, $Al_2O_3$, $SiO_2$, SiN, and a combination thereof.

\* \* \* \* \*